(12) United States Patent
Zhang et al.

(10) Patent No.: US 9,232,640 B2
(45) Date of Patent: Jan. 5, 2016

(54) THERMAL ISOLATION IN PRINTED CIRCUIT BOARD ASSEMBLIES

(71) Applicant: QUALCOMM Incorporated, San Diego, CA (US)

(72) Inventors: Yang Zhang, San Diego, CA (US); Jack B. Steenstra, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 327 days.

(21) Appl. No.: 13/792,092

(22) Filed: Mar. 10, 2013

(65) Prior Publication Data

US 2014/0254108 A1    Sep. 11, 2014

(51) Int. Cl.
*H05K 1/02*    (2006.01)
*H05K 7/02*    (2006.01)

(52) U.S. Cl.
CPC ............ *H05K 1/0298* (2013.01); *H05K 1/0201* (2013.01); *H05K 7/02* (2013.01); *H05K 2201/09663* (2013.01); *H05K 2201/09709* (2013.01); *H05K 2201/09972* (2013.01); *H05K 2201/10098* (2013.01); *H05K 2201/10151* (2013.01); *Y10T 29/4913* (2015.01); *Y10T 29/49124* (2015.01)

(58) Field of Classification Search
CPC . H05K 1/0207; H05K 1/0201; H05K 1/0265; H05K 1/0298

USPC ................. 361/704, 707, 729, 736, 746, 748; 174/252, 255, 259–264; 29/829, 832
See application file for complete search history.

(56) References Cited

U.S. PATENT DOCUMENTS

| | | |
|---|---|---|
| 5,652,042 A | 7/1997 | Kawakita et al. |
| 6,646,886 B1 | 11/2003 | Popovich et al. |
| 7,545,272 B2 | 6/2009 | Goodnow et al. |
| 2001/0024148 A1* | 9/2001 | Gerstenberg et al. ......... 333/185 |
| 2003/0163287 A1* | 8/2003 | Vock et al. ..................... 702/187 |
| 2008/0170378 A1 | 7/2008 | Ou-Yang |
| 2009/0117861 A1 | 5/2009 | Hoefel et al. |
| 2010/0319965 A1 | 12/2010 | Ortet et al. |
| 2012/0063093 A1 | 3/2012 | Meinel et al. |

OTHER PUBLICATIONS

International Search Report and Written Opinion—PCT/US2014/021293—ISA/EPO—Jul. 7, 2014.

\* cited by examiner

*Primary Examiner* — Tuan T Dinh
*Assistant Examiner* — Mukund G Patel
(74) *Attorney, Agent, or Firm* — Loza & Loza LLP (57) ABSTRACT

A printed circuit board assembly for reducing the impact of heat generated from circuitry within a handheld or non-handheld device is provided. The printed circuit board assembly may include a printed circuit board comprising a plurality of conductive layers and a plurality of dielectric layers where each dielectric layer is disposed between a pair of conductive layers. Each conductive layer may include a first portion and a second portion separated by a gap where the gaps in the alternating conductive layers are misaligned. The first portion of each conductive layer may be substantially thermally isolated from the second portion of each conductive layer.

31 Claims, 8 Drawing Sheets

THERMAL ISOLATION IN PRINTED CIRCUIT BOARD ASSEMBLIES

BACKGROUND

1. Field

Aspects of the present disclosure relate generally to printed circuit board assemblies, and more particularly, to thermally isolating heat generated from circuitry located on a printed circuit board within a printed circuit board assembly.

2. Background

Printed circuit boards include multiple conductive layers interleaved with multiple dielectric layers. Each conductive layer is typically formed into one or more pathways (known as traces) to provide a path for an electric current. Electronic components are attached to the printed circuit board and electrically connected to the traces forming a printed circuit board assembly.

Printed circuit board assemblies are utilized in a wide range of electrical and electronic equipment including both handheld and non-handheld devices. These devices have been utilized to monitor and/or measure a variety of parameters for physiological, subjective, and environmental conditions. The devices can be configured to store data related to the parameters and/or transmit, either wired or wirelessly, the data to another device.

In one example, a handheld device can be used to measure the blood glucose level of an individual. The handheld device can include a module that measures the blood glucose along with circuitry that facilitates wireless data communications. However, the heat generated from the circuitry can cause a temperature elevation in the blood glucose measurement. Any temperature elevation in the blood glucose measurement from the ambient temperature will cause inaccurate readings in the blood glucose measurements, which could have adverse effects on the individuals. Thus, there is a need for isolating the heat generated by circuitry on a printed circuit board.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspect of the disclosure. Its sole purpose is to present some concepts of one or more aspects of the disclosure in a simplified form as a prelude to the more detailed description that is presented later.

In one aspect, the disclosure provides a printed circuit board assembly for reducing the impact of heat generated from circuitry within a handheld or non-handheld device. The printed circuit board assembly can include a printed circuit board having a plurality of conductive layers; and a plurality of dielectric layers, where each dielectric layer of the plurality of dielectric layers is disposed between a pair of conductive layers in the plurality of conductive layers and each conductive layer in the plurality of conductive layers includes a first portion and a second portion separated by a gap. The gaps in alternating conductive layers are misaligned. In one example, the misaligned gaps form a curvature pattern. In another example, the misaligned gaps form a pattern of integrally connected straight segments.

The first portion of a conductive layer may be substantially thermally isolated from the second portion of the conductive layer. Furthermore, the first portion of a conductive layer may be shorter than the second portion of the conductive layer and at least some first portions of the plurality of conductive layers are of the same length.

The printed circuit board assembly may further include a wireless communication module, integrally connected to and in communication with the printed circuit board, adapted to establish a wireless communication link with an external device and a data collection module integrally connected to and in communication with the printed circuit board.

A ground plane may be formed upon a layer of the printed circuit board and one or more RF capacitors may be connected to the ground plane allowing signals at RF frequencies to pass through the one or more RF capacitors maintaining continuity of the ground plane. A metal trace may be connected to the ground plane creating a DC connection.

In another aspect, the disclosure provides a method of manufacturing a printed circuit board assembly. The method includes providing a printed circuit board; providing a plurality of conductive layers on the printed circuit board, each conductive layer having a first portion and a second portion separated by a gap where gaps in alternating conductive layers are misaligned; and providing a plurality of dielectric layers on the printed circuit board, each dielectric layer of the plurality of dielectric layers disposed between a pair of conductive layers in the plurality of conductive layers.

The method may further include providing a wireless communication module, integrally connected to and in communication with the printed circuit board, adapted to establish a wireless communication link with an external device and providing a data collection module integrally connected to and in communication with the printed circuit board.

The method may also include providing one or more RF capacitors connected to a ground plane allowing signals at RF frequencies to pass through the one or more RF capacitors maintaining continuity of the ground plane. A metal trace may be provided and connected to the ground plane creating a DC connection.

In another aspect, the disclosure provides a printed circuit board assembly. The printed circuit board assembly comprises a printed circuit board which includes a plurality of conductive means; and a plurality of dielectric means, each dielectric means of the plurality of dielectric means disposed between a pair of conductive means in the plurality of conductive means. Each conductive means in the plurality of conductive means includes a first portion and a second portion separated by a gap; and gaps in alternating conductive means are misaligned.

The printed circuit board may further include a wireless communication means, integrally connected to and in communication with the printed circuit board, adapted to establish a wireless communication link with an external device and a data collection means integrally connected to and in communication with the printed circuit board.

A ground plane may be formed upon a layer of the printed circuit board and one or more RF capacitors may be connected to the ground plane allowing signals at RF frequencies to pass through the one or more RF capacitors maintaining continuity of the ground plane. A metal trace may be connected to the ground plane creating a DC connection.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The term "handheld device" may refer to a wireless device, a mobile device, a mobile phone, a mobile communication device, a user communication device, personal digital assistant, mobile palm-held computer, a laptop computer, remote control and/or other types of mobile devices typically carried by individuals and/or having some form of communication capabilities (e.g., wireless, infrared, short-range radio, etc.). The term "non-handheld device" may refer to any device or piece of equipment containing a printed circuit board.

While the present disclosure is described primarily with respect to isolating heat generated from circuit in one functional area of a printed circuit board from other functional areas in the printed circuit board, this is by way of example only. The present disclosure may be applied and adapted to various types of handheld and non-handheld devices having one or more printed circuit boards.

In one example, the present disclosure is described with respect to isolating heat generated from wireless circuitry in a printed circuit board from data collection modules for collecting or measuring data, such as blood glucose modules, on the printed circuit board located within a handheld device. The present disclosure may be applied to any type of data collection module for collecting or measuring data in which the data will be affected by temperature elevation due to heat generated from the circuitry, such as a wireless communication module, in the handheld. The data can include, but is not limited to, a variety of parameters for physiological, subjective, and environmental conditions. Also, a variety of other embodiments are contemplated having different combinations of the below described features of the present disclosure, having features other than those described herein, or even lacking one or more of those features. As such, it is understood that the disclosure can be carried out in various other suitable modes.

The present disclosure may also be applied and adapted to various non-handheld devices or equipment for heat mitigation or isolation between one or more portions of a printed circuit board within the non-handheld devices or equipment. For example, a central processing unit (CPU) in a computer may be isolated from other electronics that are temperature sensitive as the CPU is typically a large source of heat.

According to one aspect, a printed circuit board assembly for reducing the impact of heat generated from circuitry within a handheld or non-handheld device is provided. The printed circuit board assembly may include a printed circuit board comprising a plurality of conductive layers and a plurality of dielectric layers where each dielectric layer is disposed between a pair of conductive layers. Each conductive layer may include a first portion and a second portion separated by a gap where the gaps in the alternating conductive layers are misaligned. The first portion of each conductive layer may be substantially thermally isolated from the second portion of each conductive layer.

Figure 1:
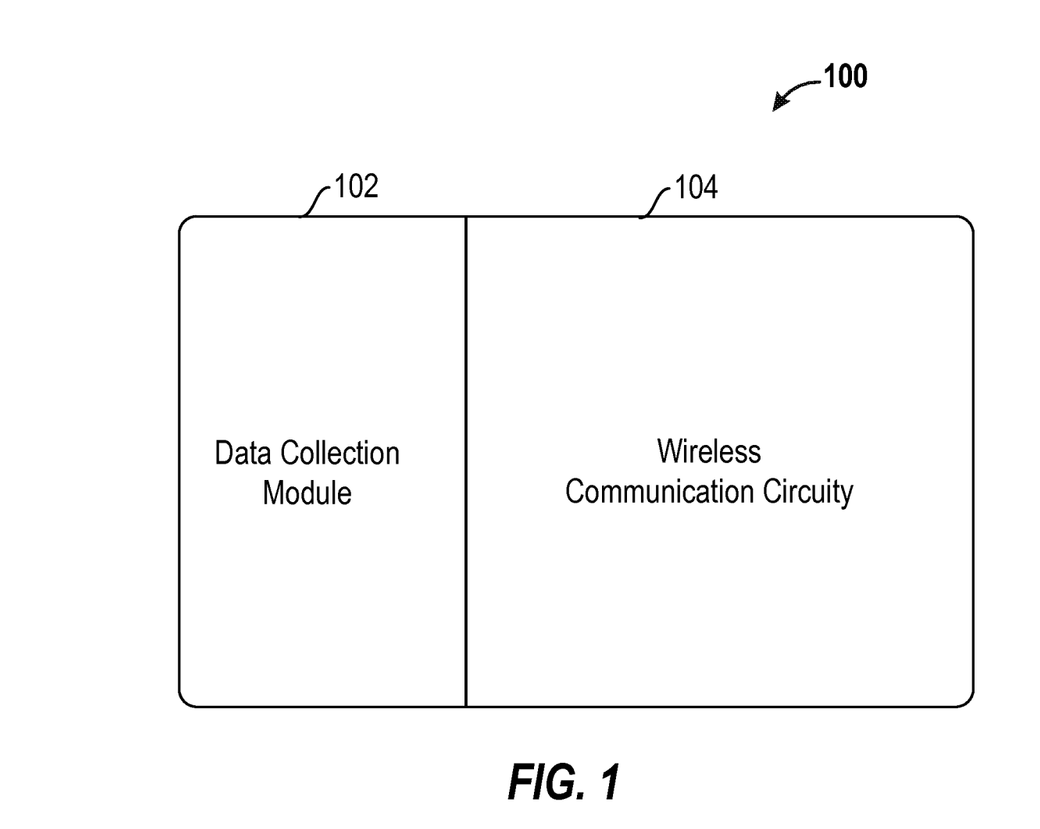
FIG. 1 illustrates a top view of a typical printed circuit board assembly.

FIG. 1 illustrates a top view of a typical printed circuit board assembly. As shown, the printed circuit board assembly 100 includes a data collection module 102, such as a blood glucose module, located on top of and next to circuitry 104, such as wireless communication circuitry. The blood glucose module 102 may be utilized for performing a blood glucose measuring function and the circuitry 104, i.e. a wireless communication module, may be adapted for establishing a wireless communication link with an external device and exchanging information with the external device via the wireless communication link. The blood glucose module 102 and the wireless communication module 104 are physically-separate units electrically connected in order to allow for an exchange of electrical signals corresponding to information to be transmitted by the wireless communication module and/or information received by the wireless communication module 104.

Figure 2:
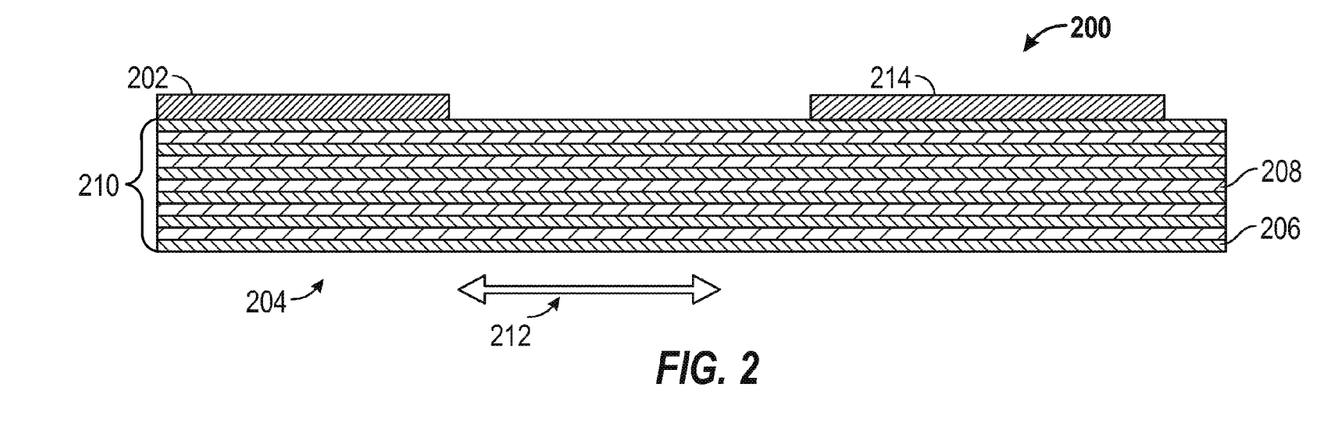
FIG. 2 illustrates a cross-sectional view of a typical printed circuit board assembly.

FIG. 2 illustrates a cross-sectional view a typical printed circuit board assembly 200 having a blood glucose module 202 located on top of a printed circuit board 204. The printed circuit board 204 includes a plurality of conductive layers 206 and a plurality of dielectric layers 208. Each dielectric layer 208 is interposed between adjacent conductive layers 206 to form a body 210 of alternate conductive layers 206 and dielectric layers 208. A wireless communication module 214, or other electrical circuitry, is attached to the printed circuit board 304. During operation, the wireless communication module 214 generates heat which is then propagated along the conductive layers 206 to the data collection module 202. The elevation in temperature can cause inaccurate readings or measurement in data collected by the data collection module 202.

Figure 3:
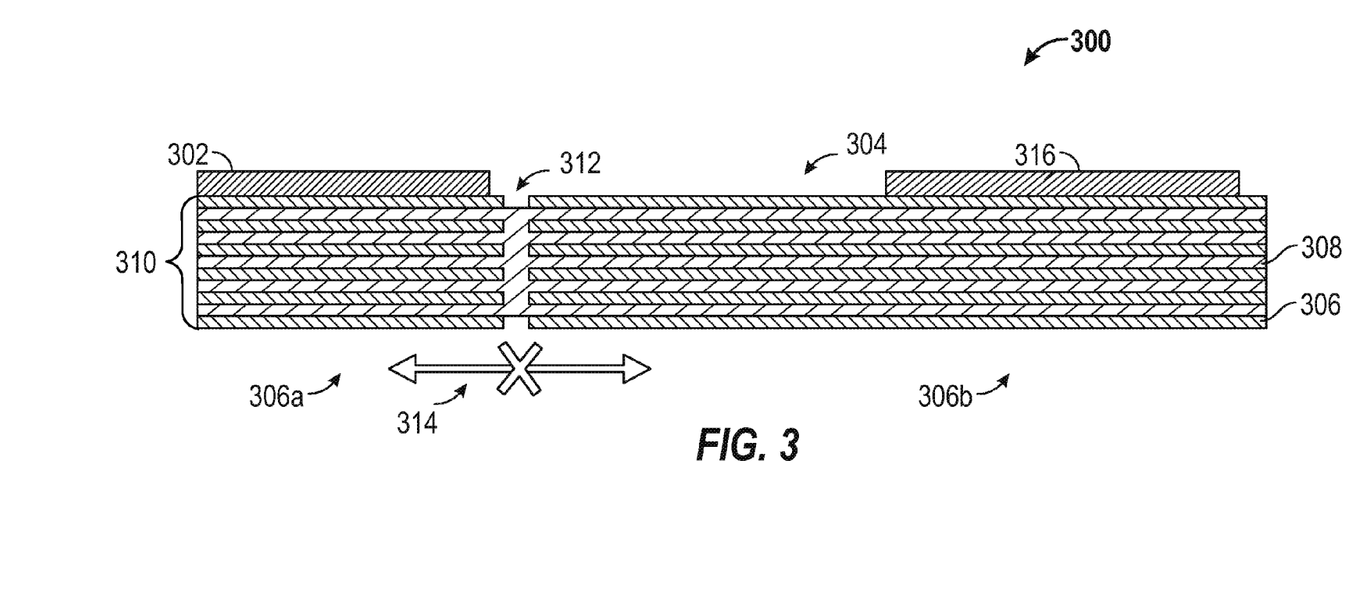
FIG. 3 illustrates a cross-sectional view a printed circuit board assembly for reducing the impact of heat generated from the circuitry located on a printed circuit board, according to one example.

FIG. 3 illustrates a cross-sectional view a printed circuit board assembly for reducing the impact of heat generated from circuitry located on a printed circuit board, according to one example. The printed circuit board assembly 300 may include a data collection module 302 located on top of a printed circuit board 304. The printed circuit board 304 may include a plurality of conductive layers 306 and a plurality of dielectric layers 308. Each dielectric layer 308 may be interposed between adjacent conductive layers 306 to form a body 310 of alternate conductive layers 306 and dielectric layers 308. The conductive layers 306 may comprise any conductive material such as metal, for example copper. The conductive layers may be etched or otherwise formed into conductive pathways, known as traces.

In one aspect, a wireless communication module 316, or other electrical circuitry, may be attached to one or both sides of the printed circuit board 304. During operation, the wireless communication module 310 may generate heat which is then propagated along the conductive layers 306. To reduce the effects of heat generated from the wireless communication module or other circuitry, the conductive layers 306 may be separated into two (2) separate functional areas 306a and 306b. By creating two separate functional areas 306a and 306b in the printed circuit board, thermal isolation may be achieved by having a slot or gap 320 in the conductive layers 306 so that the heat 314 from the second functional area 306b does not propagate to the first functional area 306a and as a result the data collection module 302. In other words, heat may not propagate freely along the conductive layers.

However, as the conductive layers in the print circuit board are separated in the same area as shown in FIG. 3, the mechanical strength of the printed circuit board may be compromised. As such, the printed circuit board assembly 300 may break in half along the area or gap 312 where there is no conductive material.

Figure 4:
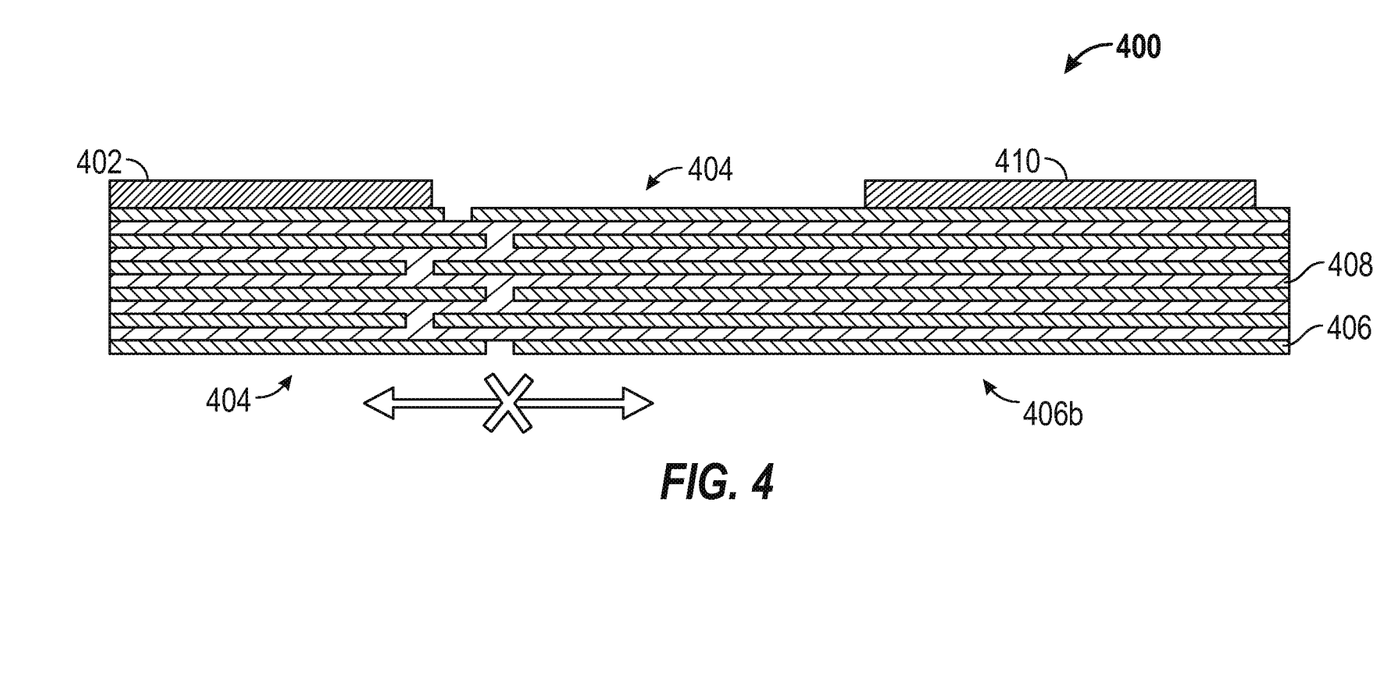
FIG. 4 illustrates a cross-sectional view a printed circuit board assembly for reducing the impact of heat generated from the circuitry located on a printed circuit board, according to one example.

FIG. 4 illustrates a cross-sectional view a printed circuit board assembly for reducing the impact of heat generated from the circuitry located on a printed circuit board, according to one example. The printed circuit board assembly 400 may include a data collection module 402 located on top of a printed circuit board 404. The printed circuit board 404 may include a plurality of conductive layers 406a-406f and a plurality of dielectric layers 408. Each dielectric layer 408 may be interposed between adjacent conductive layers 406 to form a body 410 of alternate conductive layers 406 and dielectric layers 408. The conductive layers 406 may comprise any conductive material such as metal, such as copper. The conductive layers may be etched or otherwise formed into conductive pathways, known as traces.

In one aspect, a wireless communication module 410, or other electrical circuitry, may be attached to one or both sides of the printed circuit board 404. During operation, the wireless communication module 410 may generate heat which is then propagated along the conductive layers 406. To reduce the effects of heat generated from the wireless communication module or other circuitry, each of the conductive layers 406 may include a first portion 406a and a second portion 406b separated by a gap 412. According to one aspect, the first portion 406a may have a first length and the second portion 406b may have a second length and the second length may be longer than the first length. The first portion 406a of each conductive layer may be substantially thermally isolated from the second portion 406b of each conductive layer. In one aspect, the lengths of the first portions of some, but not all of the conductive layers, are the same.

In one aspect, the lengths of the first portions 406a of the conductive layers may vary from layer to layer. As shown in FIG. 4, the printed circuit board may include six (6) conductive layers 406a-406f, a first conductive layer 406a, a second conductive layer 406b, a third conductive layer 406c, a fourth conductive layer 406d, a fifth conductive layer 406e and a sixth conductive layer 406f. In one aspect, the first portions of the first conductive layer 406a, the third conductive layer 406c and the fifth conductive layer 406e may be of the same length and the second portions of the first conductive layer 406a, the third conductive layer 406c and the fifth conductive layer 406e may be of the same length.

In one aspect, the length of the first portion of the conductive layer directly connected to the data collection module 402 may be different than the lengths of the first portions of the other conductive layers.

Figure 5:
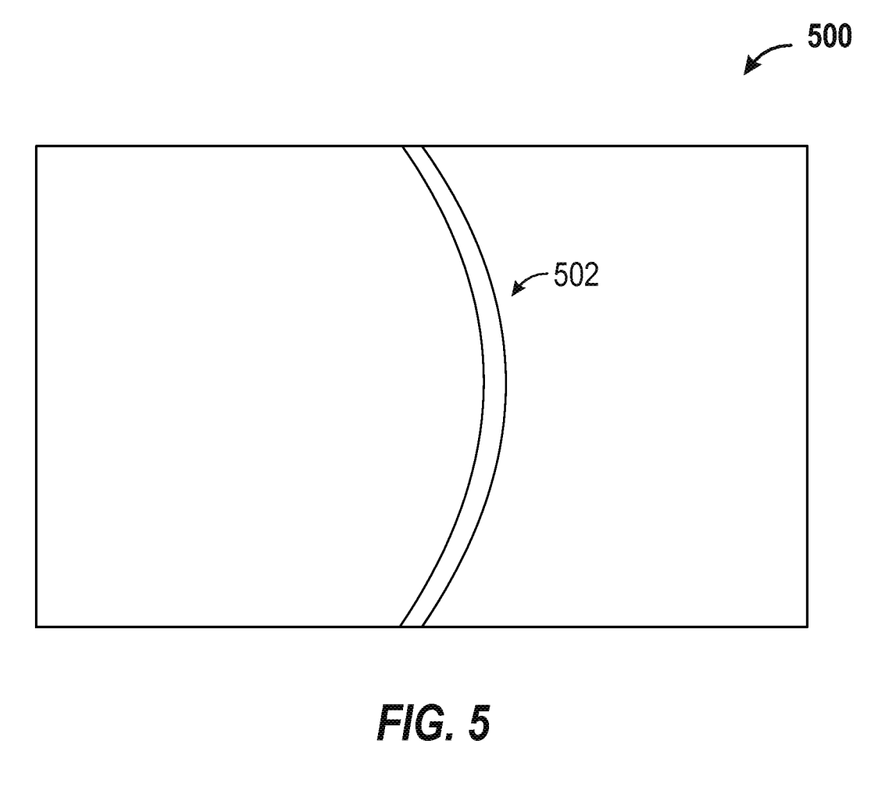
FIG. 5 illustrates a top view of a printed circuit board assembly showing a plurality of misaligned gaps forming a curvature pattern.
Figure 6:
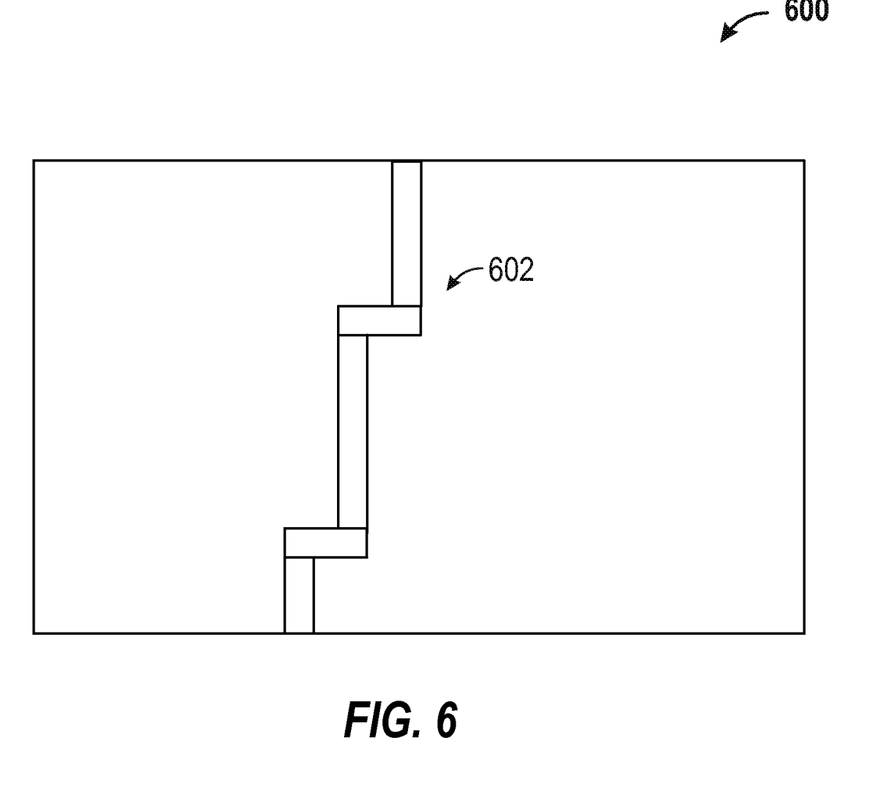
FIG. 6 illustrates a top view of a printed circuit board assembly showing a plurality of misaligned gaps forming a pattern of integrally connected straight segments, according to one example.
Figure 7:
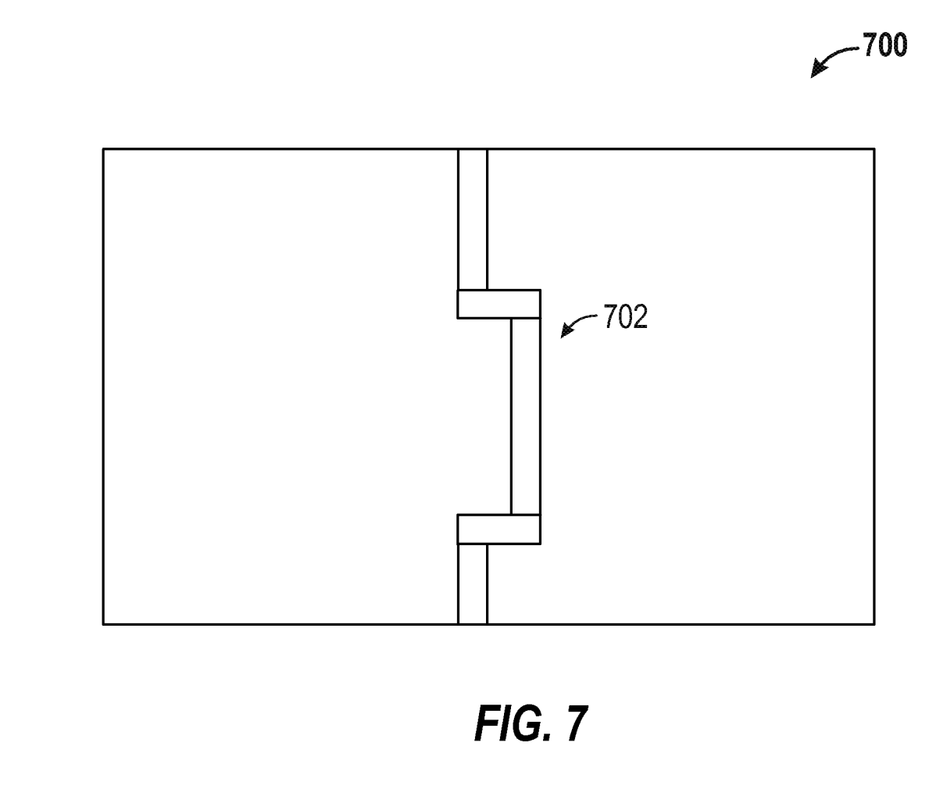
FIG. 7 illustrates a top view of a printed circuit board assembly showing a plurality of misaligned gaps forming a pattern of integrally connected straight segments, according to one example.

The alternating misaligned gaps in the conductive layers of a printed circuit board, as described above, may be formed in various patterns in addition to a linear pattern. In one example, a plurality of misaligned gaps 502 may form a curvature pattern as shown in a top view of a printed circuit board assembly 500 in FIG. 5. In other example, a plurality of misaligned gaps 602 may form a pattern of integrally connected straight segments as shown in a top view of a printed circuit board assembly 600 in FIG. 6. FIG. 7 illustrates a top view of a printed circuit board assembly 700 showing another example of a plurality of misaligned gaps forming a pattern of integrally connected straight segments 702, according to one example.

Figure 8:
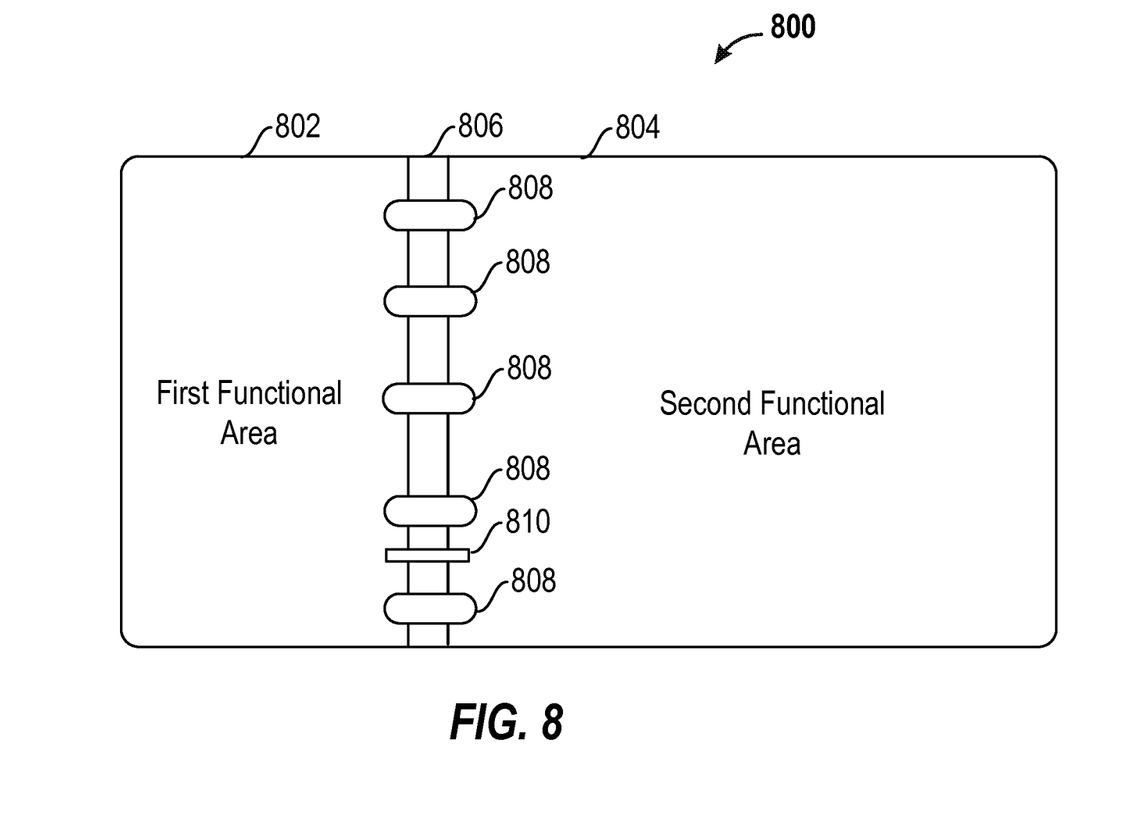
FIG. 8 illustrates a top view of a printed circuit board assembly having an antenna assembly, according to one example.

FIG. 8 illustrates a top view of a printed circuit board assembly 800 having an antenna assembly, according to one example. The printed circuit board assembly 800 may include a first functional area 802 and a second functional area 804 connected to a ground plane 806. According to one aspect, the first functional area 802 may comprise a data collection module and the second functional area 804 may comprise a wireless communication module. The wireless communication module may include an antenna for transmitting and/or receiving data. Maintaining continuity of the ground plane 806 may provide for optimal functionality of the antenna in the wireless communication module 802. In one aspect, RF capacitors 808 may be connected to the ground plane 806 allowing signals at RF frequencies to pass through the RF capacitors 806 freely so that the ground plane 808 and RF signals are continuous. For continuity at low or DC frequencies, a thin metal trace 810 may be added to creating a DC connection. In one aspect, the thin metal trace 810 may be formed of copper.

Figure 9:
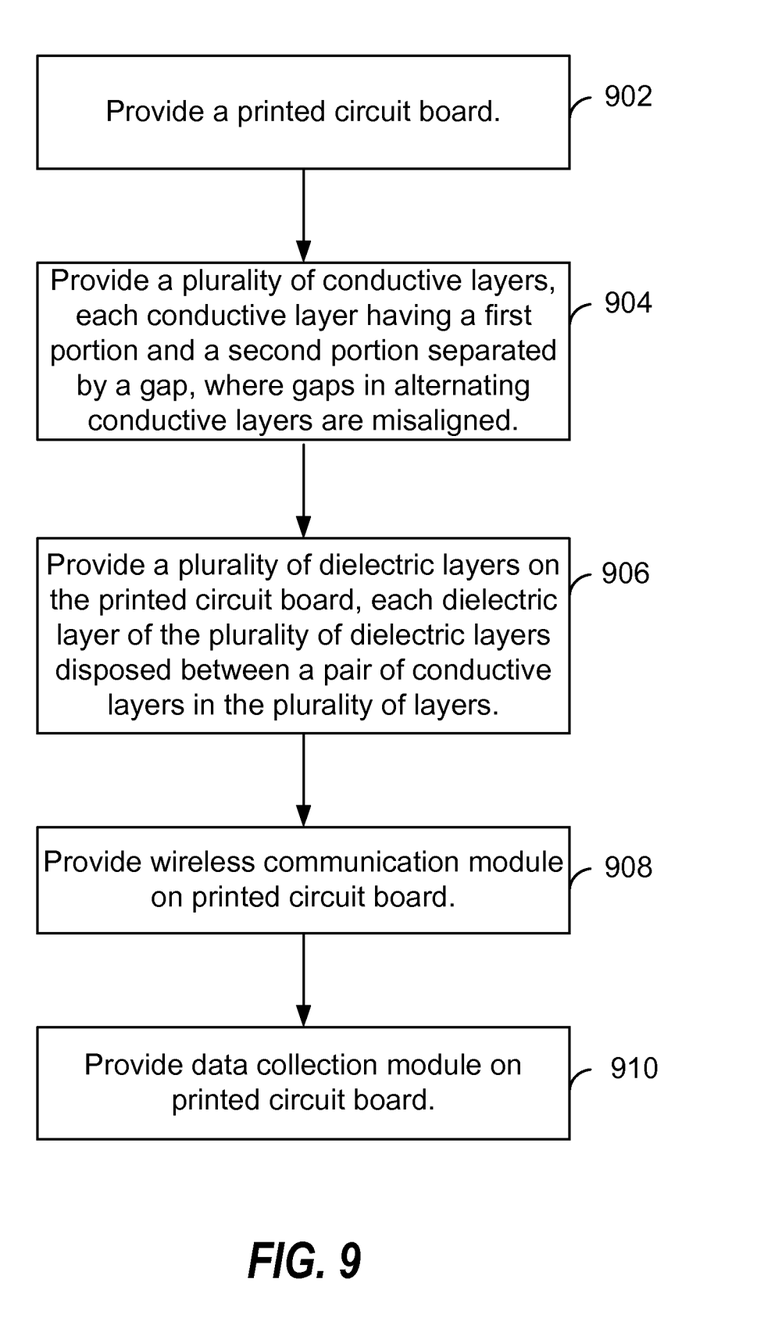
FIG. 9 illustrates a flow diagram for manufacturing a printed circuit board assembly having gaps in conductive layers for reducing the impact of heat generated from the circuitry located on a printed circuit board, according to one example.

FIG. 9 illustrates a flow diagram for manufacturing a printed circuit board assembly having gaps in conductive layers for reducing the impact of heat generated from the circuitry located on a printed circuit board, according to one example. In manufacturing the printed circuit board assembly, the process may start by providing a printed circuit board 902. A plurality of conductive layers may be provided on the printed circuit board where each conductive layer has a first portion and a second portion separated by a gap where gaps in the alternating conductive layers are misaligned 904. According to one aspect, the first portion of each conductive layer may have a first length and the second portion of each conductive layer may have a second length where the second length is longer than the first length. The first portion of each conductive layer may be substantially thermally isolated from the second portion of each conductive layer.

Next, a plurality of dielectric layers may be provided on the printed circuit board where each dielectric layer of the plurality of dielectric layers is disposed between a pair of conductive layers in the plurality of conductive layers 906. Circuitry, such as a wireless communication module, may then be provided on the printed circuit board 908 for transmitting and receiving data over a wireless communication link. In one aspect, a data collection module may be provided on the printed circuit board 910 for monitoring, measuring or collecting data.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The various features of the invention described herein can be implemented in different systems without departing from the disclosure. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

The invention claimed is:

1. A printed circuit board assembly comprising:
   a printed circuit board, the printed circuit board comprising:
   a plurality of conductive layers where each conductive layer in the plurality of conductive layers includes a first portion and a second portion separated by a gap, where first portions of the conductive layers form a first functional area and second portions of the conductive layers form a second functional area, and where at least one conductive layer is a ground plane;
   a plurality of dielectric layers, each dielectric layer of the plurality of dielectric layers disposed between a pair of conductive layers in the plurality of conductive layers; and
   a plurality of RF capacitors connected to the ground plane allowing signals at RF frequencies to pass through the plurality of RF capacitors maintaining continuity of the ground plane, the plurality of RF capacitors extending from the first functional area to the second functional area across the gap,
   wherein gaps in alternating conductive layers are misaligned.

2. The printed circuit board assembly of claim 1, wherein the first portion is shorter than the second portion.

3. The printed circuit board assembly of claim 1, wherein the first portion is substantially thermally isolated from the second portion.

4. The printed circuit board assembly of claim 1, wherein lengths of at least some first portions of the plurality of conductive layers are the same.

5. The printed circuit board assembly of claim 1, further comprising a wireless communication module, integrally connected to and in communication with the second functional area of the printed circuit board, adapted to establish a wireless communication link with an external device, the wireless communication module having an antenna assembly for transmitting and/or receiving data.

6. The printed circuit board assembly of claim 5, further comprising a data collection module integrally connected to and in communication with the printed circuit board.

7. The printed circuit board assembly of claim 6, wherein the data collection module is a blood glucose module configured to measure a blood glucose level.

8. The printed circuit board assembly of claim 1, further comprising a metal trace connected to the ground plane creating a DC connection.

9. The printed circuit board assembly of claim 1, wherein the misaligned gaps form a curvature pattern.

10. The printed circuit board assembly of claim 1, wherein the misaligned gaps form a pattern of integrally connected straight segments.

11. A method of manufacturing a printed circuit board assembly, comprising:
    providing a printed circuit board;
    providing a plurality of conductive layers on the printed circuit board, each conductive layer having a first portion and a second portion separated by a gap where gaps in alternating conductive layers are misaligned, where first portions of the conductive layers form a first functional area and second portions of the conductive layers form a second functional area, and where at least one conductive layer is a ground plane;
    providing a plurality of dielectric layers on the printed circuit board, each dielectric layer of the plurality of dielectric layers disposed between a pair of conductive layers in the plurality of conductive layers; and
    providing a plurality of RF capacitors connected to the ground plane allowing signals at RF frequencies to pass through the plurality of RF capacitors maintaining continuity of the ground plane, where the plurality of RF capacitors extend from the first functional area to the second functional area across the gap.

12. The method of claim 11, wherein the first portion is shorter than the second portion.

13. The method of claim 11, wherein the first portion is substantially thermally isolated from the second portion.

14. The method of claim 11, wherein lengths of at least some first portions of the plurality of conductive layers are the same.

15. The method of claim 11, further comprising providing a wireless communication module, integrally connected to and in communication with the second functional area of the printed circuit board, adapted to establish a wireless communication link with an external device, the wireless communication module having an antenna assembly for transmitting and/or receiving data.

16. The method of claim 15, further comprising providing a data collection module integrally connected to and in communication with the printed circuit board.

17. The method of claim 16, wherein the data collection module is a blood glucose module configured to measure a blood glucose level.

18. The method of claim 11, further comprising providing a metal trace connected to the ground plane creating a DC connection.

19. The method of claim 11, wherein the misaligned gaps form a curvature pattern.

20. The method of claim 11, wherein the misaligned gaps form a pattern of integrally connected straight segments.

21. A printed circuit board assembly comprising:
a printed circuit board, the printed circuit board comprising:
- a plurality of conductive means where each conductive means in the plurality of conductive means includes a first portion and a second portion separated by a gap, where first portions of the conductive means form a first functional area and second portions of the conductive means form a second functional area, and where at least one conductive layer is a ground plane;
- a plurality of dielectric means, each dielectric means of the plurality of dielectric means disposed between a pair of conductive means in the plurality of conductive means; and
- a plurality of RF capacitors connected to the ground plane allowing signals at RF frequencies to pass through the plurality of RF capacitors maintaining continuity of the ground plane, the plurality of RF capacitors extending from the first functional area to the second functional area across the gap, wherein gaps in alternating conductive layers are misaligned.

22. The printed circuit board assembly of claim 21, wherein the first portion is shorter than the second portion.

23. The printed circuit board assembly of claim 21, wherein the first portion is substantially thermally isolated from the second portion.

24. The printed circuit board assembly of claim 21, lengths of at least some first portions of the plurality of conductive layers are the same.

25. The printed circuit board assembly of claim 21, further a wireless means communication, integrally connected to and in communication with the printed circuit board, adapted to establish a wireless communication link with an external device.

26. The printed circuit board assembly of claim 25, further comprising a data collection means integrally connected to and in communication with the printed circuit board.

27. The printed circuit board assembly of claim 26, wherein the data collection means is a blood glucose module configured to measure a blood glucose level.

28. The printed circuit board assembly of claim 21, further comprising:
- an antenna assembly; and
- a first functional area and a second functional area connected to the ground plane.

29. The printed circuit board assembly of claim 28, further comprising a metal trace connected to the ground plane creating a DC connection.

30. The printed circuit board assembly of claim 21, wherein the misaligned gaps form a curvature pattern.

31. The printed circuit board assembly of claim 21, wherein the misaligned gaps form a pattern of integrally connected straight segments.

* * * * *